(12) United States Patent
Cherniski et al.

(10) Patent No.: US 6,297,446 B1
(45) Date of Patent: *Oct. 2, 2001

(54) HIGH PERFORMANCE EMC VENT PANEL

(75) Inventors: Andrew M. Cherniski, Rescue; Michael Wortman, Roseville, both of CA (US)

(73) Assignee: Hewlett Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,060

(22) Filed: Feb. 26, 1999

(51) Int. Cl.⁷ ..................................................... H05K 9/00
(52) U.S. Cl. ................... 174/35 R; 174/35 GC; 174/35 MS; 361/693; 361/694; 361/695; 454/184
(58) Field of Search ............................ 174/35 R, 35 MS, 174/35 GC; 361/695, 694, 693; 454/184; 55/307, 308, 350.1, 495, 496, 497, 502, 511; 29/827, 749, 34 R, 34 B; 210/335, 337

(56) References Cited

U.S. PATENT DOCUMENTS

| | | | |
|---|---|---|---|
| 4,381,421 | * | 4/1983 | Coats et al. ..................... 174/35 R |
| 4,699,681 | * | 10/1987 | Kasmark, Jr. et al. ............... 156/264 |
| 5,201,879 | * | 4/1993 | Steele .................................... 454/184 |
| 5,285,350 | * | 2/1994 | Villaume .............................. 361/690 |
| 5,697,840 | * | 12/1997 | Bainbridge et al. ................. 454/184 |
| 5,844,784 | * | 12/1998 | Moran et al. ........................ 361/818 |
| 5,890,959 | * | 4/1999 | Pettit et al. .......................... 454/184 |
| 5,928,076 | * | 7/1999 | Clements et al. .................... 454/184 |
| 6,018,125 | * | 1/2000 | Collins et al. ...................... 174/35 R |

OTHER PUBLICATIONS

Chomerics, Parker Hannifin Corp., 1998.*

* cited by examiner

Primary Examiner—William A. Cuchlinski, Jr.
Assistant Examiner—Ronnie Mancho

(57) ABSTRACT

The inventive EM panel comprises multiple layers of perforated metal sheets that are electrically connected with each other. Since multiple sheets are used, the holes can be larger than in a single sheet shield, as attenuation improvements from increased panel thickness can be traded for attenuation reductions from increased hole size. The metal sheets are perforated with equal-sized holes in a common pattern. The metal sheets are arranged in a stack such that the equal-sized holes have co-located centers. Also the holes of each sheet are lined up such that air enters the panel through the side of the panel with beveled holes. The bevel is formed from the punch used to make the holes. This prevents dust from clogging the panel. The sheets of the panel are electrically connected at the periphery of the sheets via a rivets or a gasket.

20 Claims, 3 Drawing Sheets

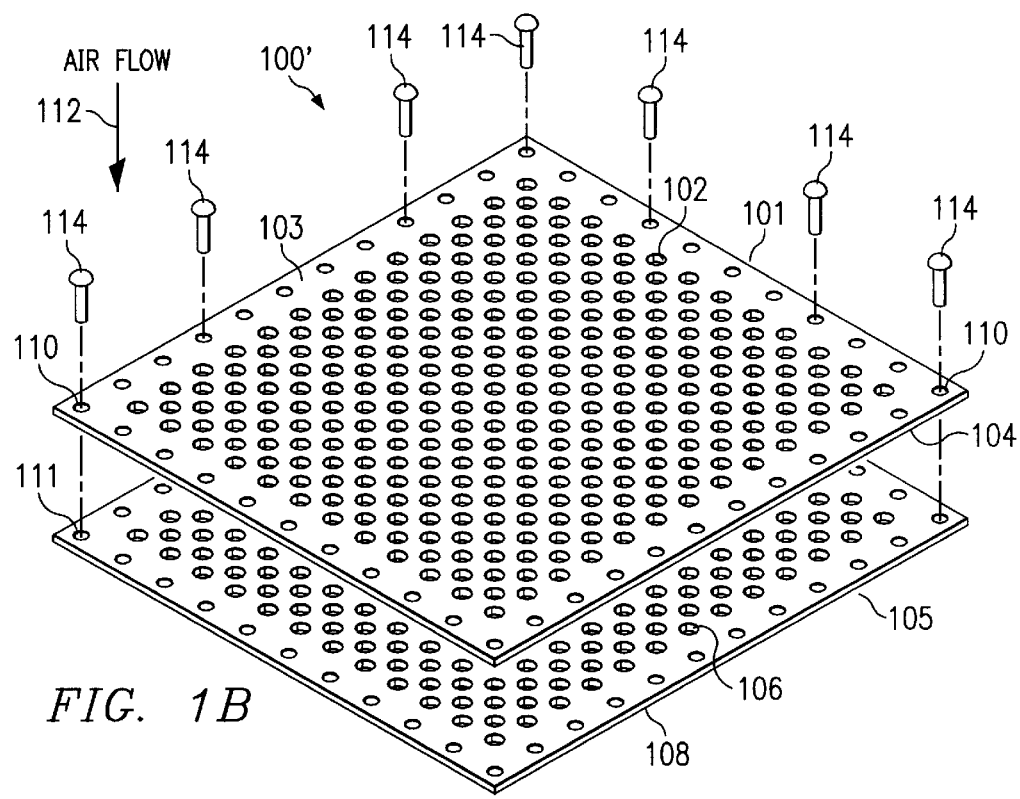
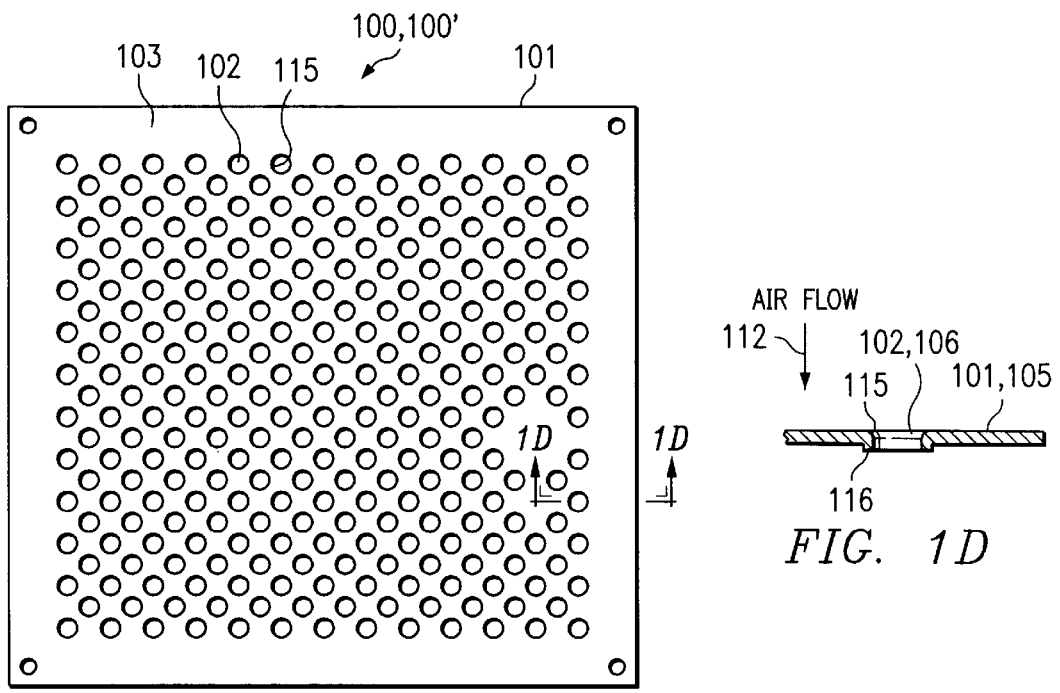

HIGH PERFORMANCE EMC VENT PANEL

TECHNICAL FIELD

This invention relates in general to electromagnetic energy containment, and in specific to an electromagnetic containment shield that allows for heat dissipation.

BACKGROUND

As computer frequencies and power increase, the radiated electromagnetic (EM) energy or noise increases proportionally. The EM energy originates from the different components in the computer system. This radiated noise interferes with the operation of other pieces of electronic equipment. Consequently, the radiating equipment is surrounded with a shield. Ideally, the best shield is a solid can, e.g. a box or sphere, that completely surrounds the radiating equipment. However, such a shield does not allow for air cooling of the equipment, as air flow would be blocked by the can. Thus, the equipment may overheat from lack of air flow.

One prior art solution is to use a perforated (perf) metal sheet as part of the EM enclosure. The perforations or holes in the enclosure would allow for air to enter and leave the system. Perf metal is made by punching an array of tightly spaced holes in a metallic sheet. When used as a shield for electromagnetic containment (EMC), perf metal allows for ventilation of an enclosure while offering some level of shielding from undesirable noise aft signals. In order for perf metal to provide effective shielding, each hole must be sized to a diameter that is small compared to the wavelength of the highest frequency to be shielded. In modem computer systems where shielding requirements typically extend to 5 Ghz or higher, hole diameters need to be very small. Holes as small as 2.0 mm are not uncommon. The following formula illustrates the relationship between attenuation (A in dB), frequency (f in 20 MHZ), hole diameter (d in M) and material thickness (t in M).

$$A \approx 20 * LOG\left(\frac{150}{(f*d)}\right) + \left(27 * \left(\frac{t}{d}\right)\right)$$

This equation reveals that as diameter (d) increases, attenuation (A) decreases by the LOG base 10. Also, this equation shows that as thickness (t) increases, attenuation (A) increases linearly. Thus, hole diameter and sheet thickness are the two primary characteristics of the shield that affect attenuation. Note that the frequency (f) term in this equation is fixed by international regulatory requirements.

Since metal sheets are relatively thin, attenuation is derived mainly from having a small hole size. Thus, as the frequency of the EM noise increases (from increasing computer speeds) and the attenuation requirements increase, the required hole size is decreased. However, hole size can only be decreased to a certain point before a non-functioning structure results. For example, as hole size is decreased, air flow is diminished. This reduces the cooling effectiveness of the EMC sheet. Moreover, too small of a hole size may result in zero airflow from the effects of turbulence. Thus, manufacturability limits often preclude the use of perf metal entirely. For example, a practical limit for 25 dB of attenuation at 2 Ghz in a 1.25 mm thick panel, provides only 62% open area for ventilation. Increasing either airflow or attenuation requirements from these levels surpasses the useful domain of conventional perf metal.

Since air flow requirements drive hole size larger and EMC requirements drive hole size smaller, the remaining variables, i.e. metal thickness and boundary size, are pushed to the limit. However, minimum boundary distances between each hole must exist to prevent excessive metal deformation. In other words, if the holes are too close together, the metal sheet is sufficiently weakened to as to easily damage during manufacturing, installation or use. As indicated by the formula, the thickness of the sheet can be increased to increase the attenuation. However, this makes manufacturing of the sheets difficult in that the holes are gang punched and not drilled. Thus, as the sheet is made thicker, it becomes more difficult to punch holes without damaging the sheet. Therefore, the sheets must remain relatively thin. Consequently, it is difficult or impossible to construct a perf sheet vent panel capable of shielding to a pre-determined level up to regulatory frequency limits and still effectively vent heat. For example, a prior art perf metal sheet for 25 dB of attenuation at 2 Ghz in a 1.25 mm thick panel has holes that are 4 mm in diameter which provides only 62% open area for ventilation.

A prior art alternative to perf metal is honeycomb vent panel 30 as shown in FIG. 3. Honeycomb vent panel comprises a relatively thick structure with very small boundaries between holes 31. The small boundaries provide substantially increased open area for ventilation, while the thick structure greatly enhances shielding capability. Because of their thickness, each hole 31 acts as a waveguide (e.g. long conductive tube or transmission line), and thus attenuates the EM noise. The honeycomb panel is typically made out of foil sheets that are built on edge. Thin metal sheets 32 are stamped into corrugated shape, typically with three sides. Glue 33 is then applied to one of the three corrugated sides 34. The sheets are then aligned to form honeycombs, and secured in place via glue 33. The honeycomb panels are then cut to the desired thickness, typically one quarter to one half inch. The resulting structure is very light, and has 90% or greater open area for ventilation. Thus, the honeycomb vents will pass large amount of air.

However, honeycomb panels have some serious problems. They are expensive to construct, when compared with perf metal, because of the amount of processing involved. The panels are also difficult to mount because of the way the sheet elements are aligned and glued. The stresses on the sheets are large, and thus a strong glue is required. Note that the glues are non-conductors, and thus, the sheets do not have good electrical interconnections. This results in a degradation in performance. The interconnection forms a capacitor, and thus a good electrical connection between the sheets will not occur until very high frequencies are used. This problem can be remedied, but the remedy greatly increases the costs of the panel. For example, one possible remedy is to solder or weld the connection points instead of using an adhesive. If this remedy is not used, then the panel will perform inconsistently. Another problem with the panel is that the sheet construction makes the panels prone to dust clogging. The panel presents a sharp sheet edge in the airflow path. Lint and dust often has the form of a filament or a fiber. When the filament hits that edge, it tends to fall over it and become caught on the edge. Then other pieces of dust then are trapped by the filament, and stick to it. After awhile, the panel builds up a dust layer that completely clogs the holes. Thus, even though the holes are larger than perf metal, dust can clog the panel. Note that there are remedies for this problem, for example coating the panel with a material to round off the edges, but the remedies greatly increases costs of the panel, and thus are not typically used.

Another prior art EMC alternative is a mesh screen that is formed by interlaced metal wires. However, this alternative incurs problems similar to both the perf metal and the honeycomb panel. Note that the wires have a finite diameter, and as the holes approach the wire diameter, the open area is reduced to 50% or less. Also, like the honeycomb panel, dust tends to collect on the wires, and thus block airflow. Moreover, the wires do not have good electrical connections at their crossing junctions. Note that the wires are touching with a low contact force, and this does not form a good electrical connection. This type of connection results in only opportunistic contact between the wires. This can be remedied by soldering the crossing points, however, this is expensive and time consuming. Thus, performance is degraded. Therefore, mesh screens may not be suitable for EMC vent shields for the systems of today.

Therefore, there is a need in the art for an inexpensive vent panel that attaches to a device, and allows sufficient air to move through the panel to permit for heat transfer from the device, while attenuating EM noise originating within the device and not collecting dust.

SUMMARY OF THE INVENTION

These and other objects, features and technical advantages are achieved by a system and method that uses an electromagnetic containment (EMC) panel which comprises multiple layers of perforated metal sheets that are electrically connected with each other. Note that since perf metal sheets are used, the cost of the inventive EMC panel is relative inexpensive as prior art processing techniques, e.g. gang punching, can be used in the manufacture of the individual sheets of the EMC panel. Also, since multiple sheets are used, the holes can be larger than in a single sheet shield, as attenuation improvements from increased panel thickness can be traded for attenuation reductions from increased hole size. Thus, airflow is improved while attenuation is maintained (or increased) from the increased thickness of the EMC panel. Note that airflow may also be improved from the increased thickness, in that as the air moves through a deeper structure, a more laminar flow is created and turbulence is reduced, resulting in better airflow from the multiple layers. Furthermore, note that multiple sheets can be added, as required to meet whatever attenuation and frequency requirements are imposed on the system being shielded.

The metal sheets are perforated with equal-sized holes in a common pattern. The metal sheets are arranged such that the equal-sized holes have co-located centers. Also the holes of each sheet are lined up such that the direction of the air flow is the same as the hole punch. The hole punch forms a chamfer or bevel that surrounds the hole on the punch entry side of the sheet. The chamfer presents a rounded surface upon which dust can not easily adhere, and thus dust tends to pass through the sheet. On the other side of the sheet or the punch exit side, the punch form a slight rim or protrusion of material that surrounds the hole, which has been displaced by the operation of the punch. Note that this sharp edge is not presented to the air flow, and would be oriented opposite the direction of the air flow. Thus, if the air is flowing out of the equipment, the chamfer is located on the surface of the panel that faces the inside of the equipment. And, if the air is flowing into the equipment, the chamfer is located on the surface of the panel that faces the outside of the equipment. This alignment prevents (or greatly reduces) the build up of dust, as the dust passes through each sheet of the panel. Therefore, the individual sheets can not be merely duplicated, but rather each sheet must be properly aligned with the other sheets of the panel, if they are not, then dust will collect. Also, each sheet must be properly aligned with the airflow, if not then sharp edges will be presented to the airflow which will collect dust.

The individual metal sheets of the EMC panel are electrically connected with each other. From the prior art, it is expected that the multiple sheets would have to be joined by at all points of their respective mating surfaces by means of re-flow solder or some other metal joining technique in order for good electrical contact to be established, and thereby result in the effective thickness of the panel to equal the sum of the thicknesses of the sheets. Especially in view of the poor electrical performance of the honeycomb panel and the mesh panel. However, testing has shown that only the perimeters of adjacent sheets need to be electrically joined to be effective as an EMC panel. Furthermore, it has been found that small spaces between the sheets neither aids nor detracts from the EMC performance of the composite panel assembly so long as the perimeter is joined. Note it has also been found that the attenuation performance depends on the total metal thickness through the assembly and not the combination of metal thickness and air space between adjacent panels. The electrical connection between the peripheral portions of sheets can be formed with any mechanism that provides a low impedance electrical path between the adjacent sheets. For example, an RF gasket or close spaced rivets.

Therefore, it is a technical advantage of the present invention to provide an efficient EMI enclosure that allows for the passage of cooling air.

It is another technical advantage of the present invention that uses multiple perforated metal sheets to form the EMI panel that are stacked with the holes of each of the sheets having co-located centers.

It is a further technical advantage of the present invention that each of the sheets are arranged such that the direction of the punch used to form the holes is the same direction as the air flow through the panel.

It is a further technical advantage of the present invention that the sheets that form the panel are electrically connected with each other at the periphery of the sheets.

It is a further technical advantage of the present invention that the attenuation of the panel is improved by the thickness of the individual sheets that form the panel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention and the advantages thereof, reference is now made to the following descriptions taken in conjunction with the accompanying drawing, in which:

FIG. 1B depicts an exploded view of a second embodiment of the inventive panel;

FIG. 1C depicts a plan view of the embodiments of FIGS. 1A and 1B;

FIG. 1D depicts the details of a hole in the panel of FIGS. 1A and 1B;

DETAILED DESCRIPTION

Figure 1A:
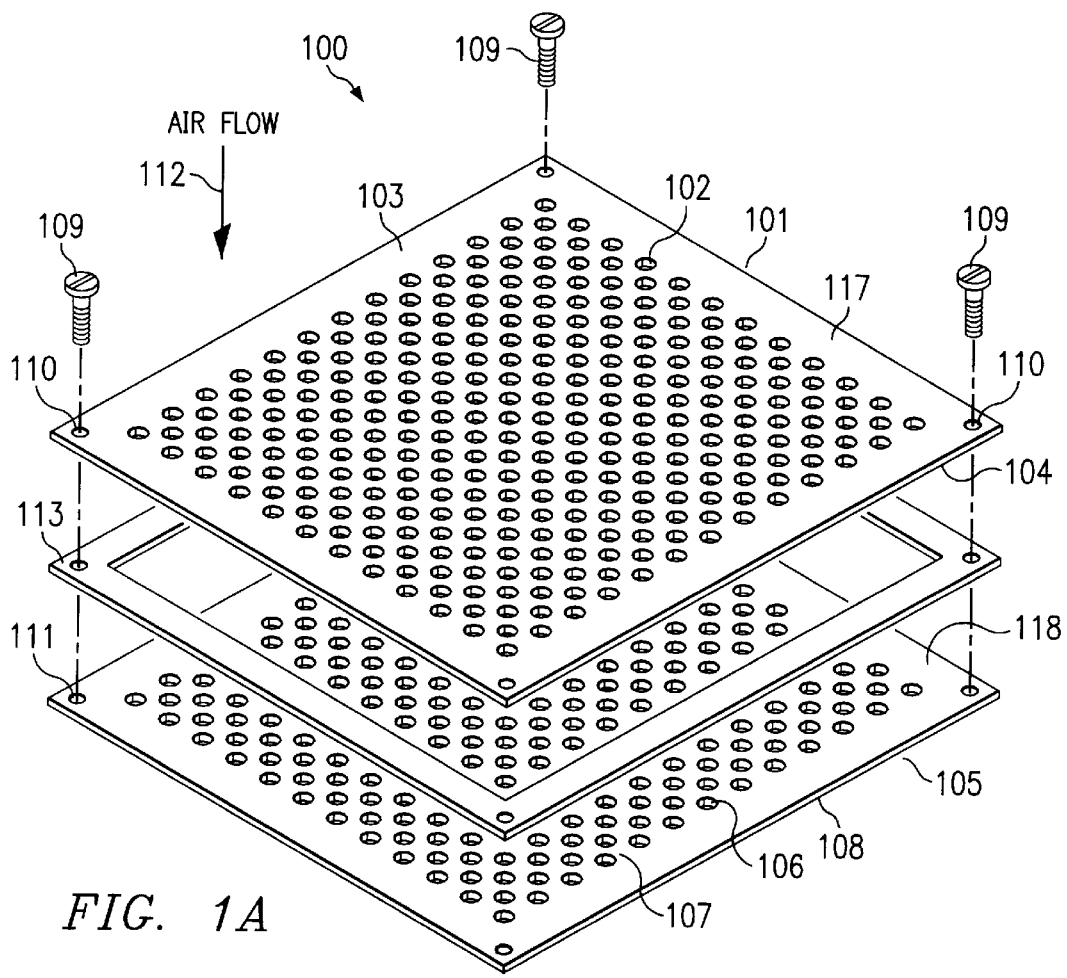
FIG. 1A depicts an exploded view of a first embodiment of the inventive panel.
Figure 3:
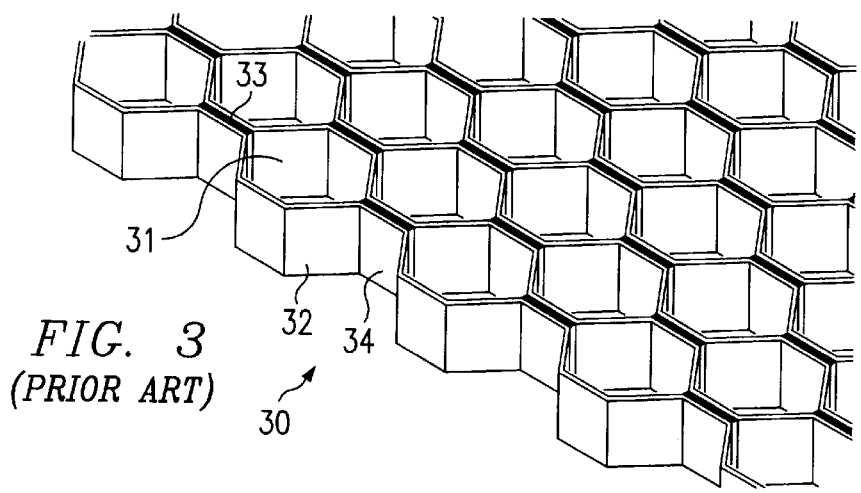
FIG. 3 depicts a prior art honeycomb vent panel.

FIG. 1A depicts an exploded view of the first embodiment of the inventive panel 100, which is shown to comprise two sheets, 101 and 105. Only two sheets are shown for the sake of simplicity, although the inventive panel 100 could include more than two sheets, depending upon the attenuation requirements and heat dissipation requirements of the equipment (not shown) being shielded.

The panel 100 is used to form an EMI enclosure, e.g. a Faraday cage, with other metal sheets, which may or may not be perforated. The panel 100 would be attached to the remainder of the EMI enclosure via an attachment mechanism, such as soldering (or welding), screws, rivets, glue, quick disconnects, and the like. Note any fastener would suffice, so long as an EM seal is maintained between the panel 100 and the EM enclosure. Further note that the panel is shown as being square in shape, however, the panel 100 may be of any shape, e.g. triangle, circle, etc., so long as it properly couples with the remainder of the EMI enclosure.

The equipment within the enclosure could be any EM producing equipment such as an electric motor, a magnetron (e.g. for a microwave oven), computers, computer components, radios, and the like. Thus, any EM energy released by the equipment would be contained within the EMI enclosure. Moreover, the EMI enclosure would also function to prevent the entry of EMI energy into the enclosure. Thus, the equipment within the enclosure would be protected from external EMI energy. Note that one of the sheets of the panels may be an integral part of the EMI enclosure, so mounting the panel can be performed by perforating the enclosure wall and adding one or more separate metal sheets to the perforated wall via rivets.

The panel 100 of FIG. 1A increases attenuation through increasing the thickness of the panel, via multiple sheets 101,105 that are joined as a single electrical structure. In this way, panel thickness in excess of that possible with single panels can provide improved EMC performance without sacrificing airflow characteristics.. Improved airflow can be increased by trading for performance by enlarging hole diameter, which sacrifices some of the EMC performance gains of the increased thickness. The upper limit of performance trading is reached when the hole diameters approach waveguide cutoff (Cutoff in meters) for frequency (f in MHZ) as illustrated in the equation below. Note that cutoff and frequency are inversely proportional and scaled against 150 Meters. For example the maximum hole size up to 2.0 Ghz is 75 mm.

$$CutOff \approx \left(\frac{150}{f}\right)$$

Each sheet 101, 105 includes a plurality of holes 102, 106. The pattern of the holes is selected to provide a maximum number of holes per sheet. Specifically, the pattern is a 60 degree interlaced pattern. This provides the maximum open area for air flow. The preferred to shape of the holes is round or circular. This shape does not have any corners for dust to become trapped. Another acceptable shape is oval or elliptical. This shape also does not have any corners. Other shapes such as square, rectangle, honeycomb, triangle, trapezoid could be used in the inventive panel, but may collect dust. The sheets themselves are made from metal or a metal coated material. Note that a plastic sheet could be used, if it is coated with a conductive material. The metal may be any conductive metal, such as aluminum, gold, silver, copper, ferrous metals, metal alloys, or any other material suitable for use as a Faraday cage. The holes are preferably formed by a standard punching technique, in which multiple holes (or the entire sheet) are gang punched at once. However, other techniques could be used such as drilling. The actual thickness of the sheet depends on the characteristics of the metal in the sheet, for example, a mild steel material sheet should be less than 1.5 mm thick to enable proper punching. Note that this invention could include any shape hole punched or drilled in any pattern. Round holes on 60° interlaced pattern are preferred because this provides the most efficient air flow characteristics for a given EMC attenuation valve.

The holes in each sheet used in the panel have a common pattern. Thus, when the sheets are stacked on top of each other, as shown in FIG. 1C, a particular hole in the pattern of one sheet will line up with a corresponding hole in each of the remaining sheets in the stack. In other words, the centers of the respective holes of the different sheets of the panel are co-located. This provides maximum air flow through the panel. The panels are also nested with each other. Nesting refers to panel orientation where all sharp hole edges are in the downstream airflow path 112. FIG. 1D depicts the details of one hole of a sheet of the panel. The process of punching holes creates a bevel or chamfer 115 on one side 103, 107 of the sheet, namely the side in which the punch enters the sheet. The process of punching holes also creates a rim 116 on the other side 104, 108 of the sheet, namely the side in which the punch breaks through the sheet. The rim represents a sharp edge, and panel nesting ensures that no sharp edges are available for dust to collect. Instead, the beveled edge of the hole presented a rounded surface that will not catch dust. When the sheets are placed in intimate contact with others in the nested arrangement, the rim 116 of one sheet will fit into the bevel of the adjacent sheet, thus aiding in alignment of the sheets one to another. Note that each sheet of the panel must be oriented in the same manner to prevent dust from collecting.

A important aspect of this invention is the manner in which the sheets 101, 105 are joined. The sheets may be electrically joined at all points throughout their mating surfaces via re-flow solder or some other metal joining technique. However, it has been empirically shown that this type of joining is not necessary (or practical, as it is costly and time consuming). Testing using dual reverberation chambers according the modified IEEE 285 standard has shown that only the perimeter 117, 118 of adjacent sheets need to be electrically joined to be obtain effective EM attenuation. The performance obtained with only the perimeters electrically connected is similar to having all points connected. Also note that small spaces between the sheets does not aid or detract from the EMC performance of the panel, so long as the perimeters 117, 118 are joined. Thus, the performance of a panel that has its sheets spaced apart from each other is similar to a panel that has its sheets in contact with each other, so long as the peripheral portions of the sheets are electrically connected with each other. The EMC benefits of the panel is the result of the total metal thickness of the sheets in the panel and not the combination of metal thickness and air space between adjacent panels, i.e. the thickness of the panel. Note that the electrical connection must be a good electrical connection, i.e. a high current, low impedance connection. If the sheets are merely stacked on top of each other, a good electrical connection is not formed, and the attenuation of the panel will not be satisfactory.

The perimeters 117, 118 of the sheets of the panels can be joined by any mechanism that provides a low impedance electrical path between the adjacent sheets. The sheets may be joined in essentially two ways. One way is to have the peripheral portions electrically joined via a high compressive force. The sheets may be directly contacting each other, or the sheets may include a conductive gasket placed between the peripheral portions of the sheets. The element(s) exerting the force may be comprised of any suitably strong material, e.g. metal and/or plastic. The second way is to have a plurality of metal fasteners electrically connect the sheets. The fasteners would be spaced apart a predetermined distance so as to form a Faraday cage that contains particular frequencies of EM energy. Note that the sheet-to-sheet connection need not be tight as the electrical connection of the sheets is through the metal fasteners. However, the sheet-to-fastener connections should be high force connections. FIG. 1A depicts a gasket 113, which is placed between the sheets and physically held in place by fasteners 109. These fasteners may include ¼ turn disconnects, screws, nails, glue, brackets, or rivets. The fasteners may be made from any material since the connection is provided by the gasket, however metal is preferred. One such gasket is Flectron® cloth on foam. FIG. 1B, which is similar to FIG. 1A, depicts an alternative connection mechanism. In this embodiment, which is the preferred embodiment, a plurality of metal fasteners 114 spaced apart by a predetermined distance a placed on the peripheral portions of the sheets. The fasteners may include ¼ turn disconnects, nails, screws, rivets, or brackets. The fasteners should be composed of metal that is suitable to form a Faraday shield. However, if the sheets can be fitted tightly together at the periphery such that an EM seal is formed at the periphery, then non-Faraday materials may be used, e.g. plastic. Rivets are the preferred fastener, since they tend to form more permanent attachments. However, if the panel needs to be frequently opened, then a removable fastener should be used, e.g. screws. Note that only two lines of fasteners are shown for the sake of simplicity. The predetermined distance is determined by the highest frequency desired to be attenuated. For example, 2 GHz would require about ½ inch spacing on the centers of the rivets. The fasteners provide an intimate metal-to-metal connection between the metal sheets. The fasteners pull the peripheral portions of the sheets in contact with each other. A conductive adhesive can also be used in conjunction with the fasteners to enhance the contact between the peripheral portions of the sheets. Other connection mechanisms could include welding, soldering, conductive adhesive, and/or clamping.

Figure 2A:
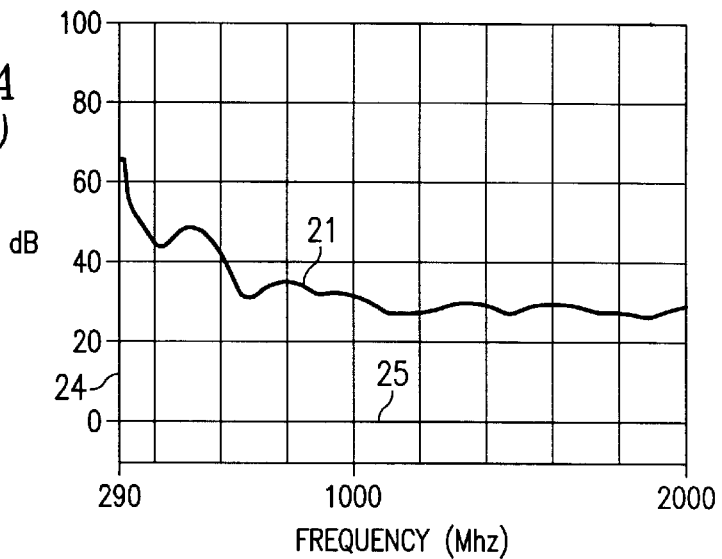
FIG. 2A depicts the attenuation characteristics for a prior art single sheet panel.
Figure 2B:
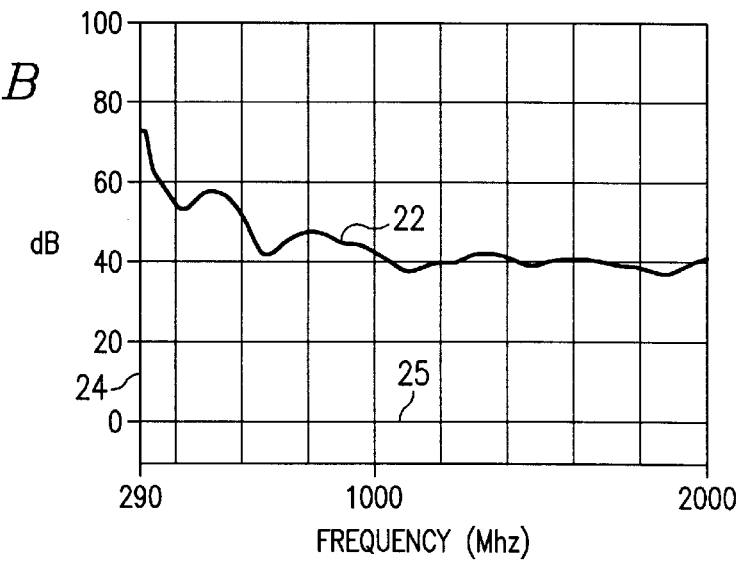
FIG. 2B depicts the attenuation characteristics for the inventive panels of FIGS. 1A and 1B.
Figure 2C:
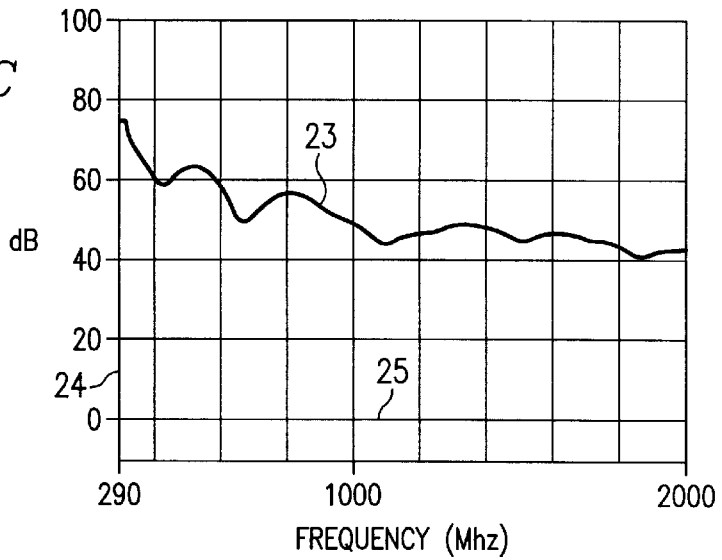
FIG. 2C depicts the attenuation characteristics for an embodiment of the inventive panel of FIGS. 1A and 1B having three sheets.

FIGS. 2B and 2C depict examples of the testing results of the inventive panel of FIG. 1A. Note that the results would be similar for the panel of FIG. 1B. For comparison, FIG. 2A depicts the results of the prior art. The vertical axis 24 is the attenuation in dB, with each major division being 20 dB, and the scale is from 0 dB to 100 dB. The horizontal axis is the frequency in MHZ, with each major division being 200 MHZ, and the scale is from 290 MHZ to 2000 MHZ. The plots are the minimum average lines of the actual data. This is a conservative or worst case measure. Readings are read upscale from the 0 dB line to the minimum average line. As shown FIG. 2A, plot 21 depicts the attenuation for the prior art arrangement of a single perforated sheet, with the attenuation being about a 25 dB minimum level up to 2.0 Ghz. FIG. 2B depicts the attenuation for the inventive panel having two joined and nested sheets, with the attenuation being about a 35 dB minimum level up to 2.0 Ghz. FIG. 2C depicts the attenuation for the inventive panel having three joined and nested sheets, with the attenuation being about a 40 dB minimum level up to 2.0 Ghz. The metal sheets used in this test are comprised of a zinc plated steel that is 1.25 mm thick. The holes are 4.76 mm round holes placed on a 60° interlaced pattern to obtain maximum perforation. The open area consumes 62.5% of the perforated area.

Although the present invention and its advantages have been described in detail, it should be understood that various changes, substitutions and alterations can be made herein without departing from the spirit and scope of the invention as defined by the appended claims.

What is claimed is:

1. A panel that attenuates electromagnetic energy passing there through and permits air to pass there through, the panel comprising:

a plurality of metal sheets, with a portion of each sheet having a plurality of holes that are arranged in a common pattern with the remaining sheets of the plurality of sheets; and at least one electrically conductive connector that connects one metal sheet of the plurality of metal sheets with an adjacent metal sheet of the plurality of metal sheets with a low impedance electrical connection;

wherein the plurality of sheets are arranged in a stack, with the center of each of the holes of the one metal sheet being co-located with the center of a respective hole of the adjacent sheet.

2. The panel of claim 1, wherein:

a number of sheets of the plurality of sheets and a size of the holes are selected to provide a particular level of attenuation for a particular frequency of the electromagnetic energy.

3. The panel of claim 1, wherein:

each hole in each of the metal sheets of the plurality of metal sheets is formed by punching, which causes a bevel to be formed on one side of the hole and rim to be formed on the other side of the hole; and each bevel of each hole is located on one side of the metal sheet of the plurality of metal sheets and each rim of each hole is located on the other side of the sheet of the plurality of metal sheets.

4. The panel of claim 3, wherein the stack is arranged with the other side of the one sheet being adjacent to the one side of the adjacent sheet, and the air enters the panel on the one side of the one sheet.

5. The panel of claim 1, wherein the at least one electrically conductive connector comprises:

a gasket that contacts a peripheral portion of the one sheet and contacts a peripheral portion of the adjacent sheet.

6. The panel of claim 5, further comprising:
a gap between the one sheet and the adjacent sheet.

7. The panel of claim 1, wherein the conductor comprises:
a plurality of metal fasteners that attach a peripheral portion of the one sheet and a peripheral portion of the adjacent sheet;
wherein the metal fasteners are spaced apart from each other at a predetermined distance.

8. The panel of claim 7, wherein the plurality of metal fasteners are a plurality of rivets.

9. The panel of claim 1, wherein:
the plurality of holes are round holes; and
the common pattern is a 60 degree interlaced pattern.

10. The panel of claim 1, wherein:
the panel is a portion of an electromagnetic shield that encloses at least one piece of equipment that requires the air for cooling.

11. A method for providing a piece of equipment that is surrounded by an electromagnetic shield with air for cooling, the method uses a panel that attenuates electromagnetic energy passing there through and permits air to pass there through, the method comprising the steps of:
providing a plurality of metal sheets;
providing each sheet with a plurality of holes that are arranged in a common pattern with the remaining metal sheets of the plurality of metal sheets;
arranging the plurality of metal sheets in a stack, with the center of each of the holes of one metal sheet of the plurality of metal sheets being co-located with the center of a respective hole of an adjacent metal sheet of the plurality of metal sheets; and
connecting the one metal sheet with the adjacent metal sheet with a low impedance electrical connection to form the panel.

12. The method of claim 11, further comprising the step of:
selecting a number of sheets of the plurality of sheets and a size of the holes to provide a particular level of attenuation for a particular frequency of the electromagnetic energy.

13. The method of claim 11, wherein the step of providing each sheet with a plurality of holes comprises the step of:
forming each hole in each of the metal sheets of the plurality of metal sheets by punching, which causes a bevel to be formed on one side of the hole and rim to be formed on the other side of the hole;
wherein each bevel of each hole is located on one side of the metal sheet of the plurality of metal sheets and each rim of each hole is located on the other side of the sheet of the plurality of metal sheets.

14. The method of claim 13, further comprising the step of:
arranging the stack with the other side of the one sheet being adjacent to the one side of the adjacent sheet;
wherein the air enters the panel on the one side of the one sheet.

15. The method of claim 11, wherein the step of connecting comprises the step of:
providing a gasket that contacts a peripheral portion of the one sheet and contacts a peripheral portion of the adjacent sheet.

16. The method of claim 15, wherein the step of connecting further comprises the step of:
spacing the one sheet apart from the adjacent sheet.

17. The method of claim 11, wherein the step of connecting comprises the step of:
attaching peripheral portion of the one sheet and a peripheral portion of the adjacent sheet with a plurality of metal fasteners;
wherein the metal fasteners are spaced apart from each other at a predetermined distance.

18. The method of claim 17, wherein the plurality of metal fasteners are a plurality of rivets.

19. The method of claim 11, wherein:
the plurality of holes are round holes; and
the common pattern is a 60 degree interlaced pattern.

20. A panel that attenuates electromagnetic energy passing there through and permits air to pass there through, wherein the panel is a portion of an electromagnetic shield that encloses at least one piece of equipment that requires the air for cooling, the panel comprising:
a plurality of metal sheets, with a portion of each sheet having a plurality of holes that are arranged in a 60 degree interlaced pattern, with each hole in each of the metal sheets being formed by punching which causes a bevel to be formed on one side of the hole and rim to be formed on the other side of the hole, and with each bevel of each hole being located on one side of the metal sheet of the plurality of metal sheets and each rim of each hole being located on the other side of the sheet of the plurality of metal sheets; and
a plurality of metal fasteners that electrically connects a peripheral portion of one sheet of the plurality of metal sheets and a peripheral portion of an adjacent sheet of the plurality of metal sheets with a low impedance electrical connection, with the metal fasteners being spaced apart from each other at a predetermined distance;
wherein the plurality of sheets are arranged in a stack, with the center of each of the holes of the one metal sheet being co-located with the center of a respective hole of the adjacent sheet;
a number of sheets of the plurality of sheets and a size of the holes are selected to provide a particular level of attenuation for a particular frequency of the electromagnetic energy; and
the stack is arranged with the other side of the one sheet being adjacent to the one side of the adjacent sheet, and the air enters the panel on the one side of the one sheet.

* * * * *